(12) United States Patent
Karnik et al.

(10) Patent No.: US 6,366,132 B1
(45) Date of Patent: Apr. 2, 2002

(54) SOFT ERROR RESISTANT CIRCUITS

(75) Inventors: Tanay Karnik, Portland; Ram K. Krishnamurthy, Beaverton, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,881

(22) Filed: Dec. 29, 1999

(51) Int. Cl.$^7$ ............................................. H03K 19/096
(52) U.S. Cl. ............................ 326/121; 326/95; 326/21
(58) Field of Search ............................ 326/93, 95, 98, 326/112, 119, 121, 21, 31, 34

(56) References Cited

U.S. PATENT DOCUMENTS

| | | | | |
|---|---|---|---|---|
| 5,767,717 A | * | 6/1998 | Schorn et al. ............... | 327/210 |
| 5,854,565 A | * | 12/1998 | Jha et al. ..................... | 327/211 |
| 5,903,180 A | * | 5/1999 | Hsia et al. ................... | 327/199 |
| 5,973,530 A | * | 10/1999 | Morris et al. ................ | 326/86 |
| 6,026,011 A | * | 2/2000 | Zhang ......................... | 327/210 |
| 6,107,852 A | * | 8/2000 | Durham et al. .............. | 327/211 |

OTHER PUBLICATIONS

T. Calin et al. "Upset Hardened Memory Design for Submicron CMOS Technology", IEEE Transactions on Nuclear Science, vol. 43, No. 6, Dec. 1996, pp. 2874–2878.

* cited by examiner

Primary Examiner—Michael Tokar
Assistant Examiner—Don Phu Le
(74) Attorney, Agent, or Firm—Alan K. Aldous

(57) ABSTRACT

In some embodiments, the invention includes a soft error resistant latch circuit. The latch circuit includes a storage node, a feedback node, and an inverter between the storage node and the feedback node. The latch circuit also includes split connection storage node drivers and split connection feedback node drivers each connected to the storage node and the feedback node. In some embodiments, the invention includes a soft error resistant domino circuit a domino node, a keeper node, and a soft error resistant keeper. The soft error resistant keeper includes (a) a FET having a gate connected to the keeper node; (b) a FET having a gate connected to the domino node; and (c) an inverter between the domino and keeper nodes. In some embodiments, the invention includes a soft error resistant domino circuit having a domino node, a keeper node, and an inverter between the domino and keeper nodes. The circuit also includes reverse connection keeper drivers connected between the domino node and the keeper node.

34 Claims, 4 Drawing Sheets

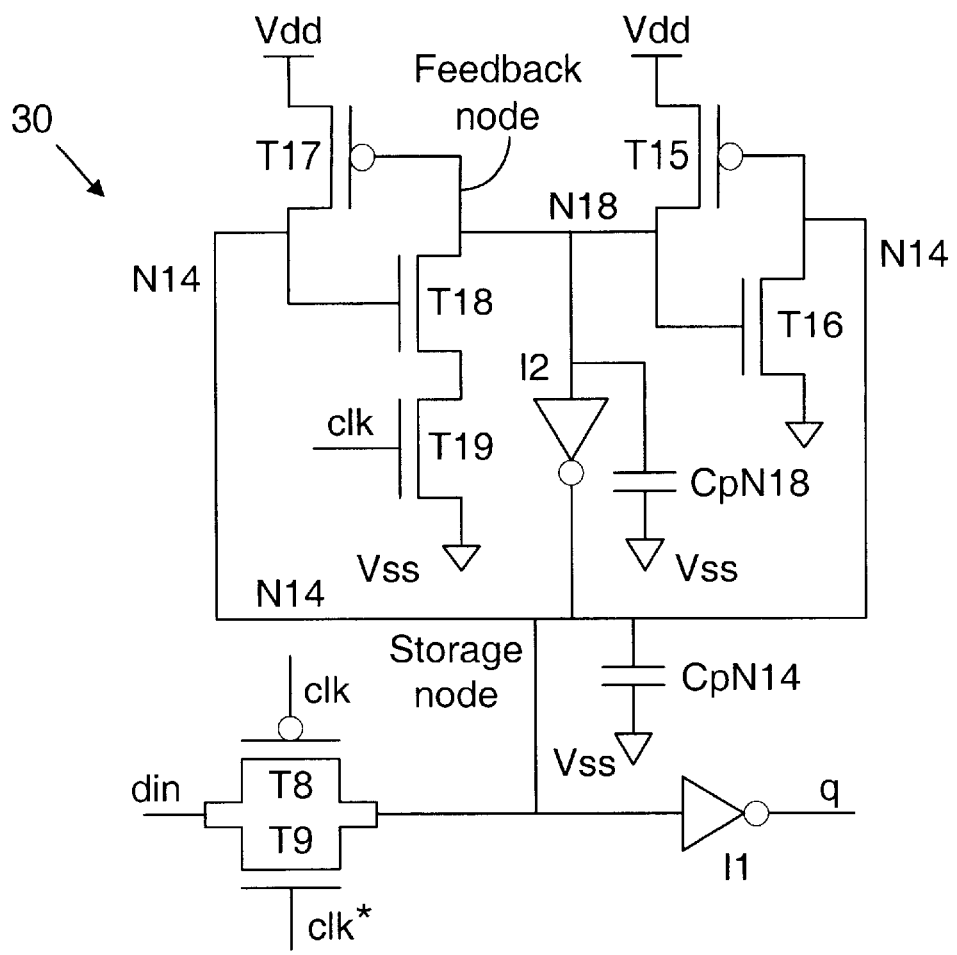
FIG. 3
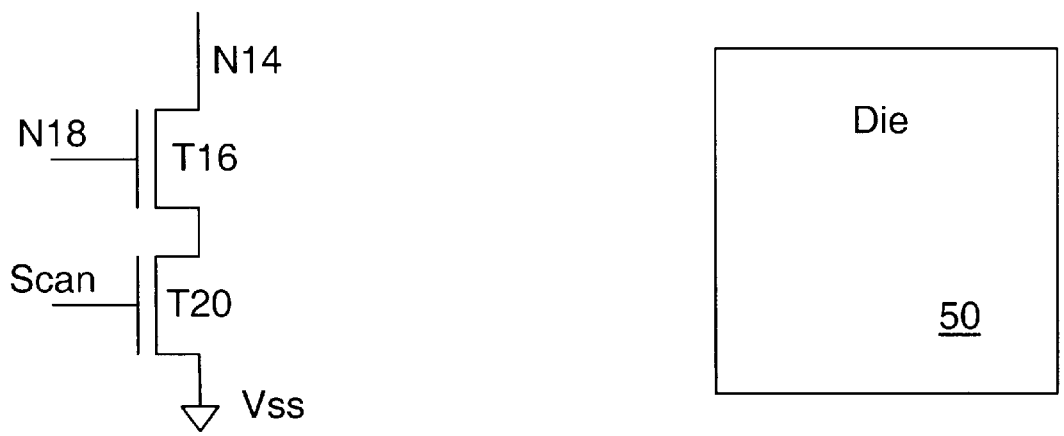
FIG. 4
FIG. 5

US 6,366,132 B1

SOFT ERROR RESISTANT CIRCUITS

BACKGROUND OF THE INVENTION

1. Technical Field of the Invention

The present invention relates to circuits and, more particularly, to soft error resistant circuits, such as latches and dynamic circuits.

2. Background Art

Integrated circuit technology design has scaled over time. In particular, operating voltage and transistor device dimensions have become smaller and the chips are operating at higher frequencies. Hence the integrated circuits are becoming more susceptible to external interference. Cosmic rays have caused soft errors in memories and storage elements in the chips used at high altitudes by the aerospace community. A soft error is a change in the voltage state of a node in a circuit due to cosmic rays. Cosmic rays are increasingly likely to cause soft errors in integrated chips at ground levels because of the scaling of dimensions and voltage. The storage elements in a datapath such as in static latches and dynamic gates are becoming susceptible to soft errors and there is concern for an associated soft error rate (SER). Additional complexity arises from the lack of error correction in datapath.

Both neutrons and alpha particles can cause soft errors. Neutrons may cause hole-electron pairs in the substrate and also in wells close to the surface of the integrated circuit. An alpha particle may also cause hole-electron pairs to be created in the substrate, but it is believed that the alpha particles typically travel deeper into the integrated circuit so as to pass through wells.

As an example, FIG. 1 illustrates a schematic cross-sectional view of a portion of an integrated circuit 10 having an n-channel metal oxide semiconductor field effect transistor (NMOSFET) 14 and p-channel metal oxide semiconductor field effect transistor (PMOSFET) 16. In the example, the drain diffusions D of NMOSFET 14 and PMOSFET 16 are connected at a node N1 and the source diffusions S are respectively connected to a ground voltage (sometimes called Vss) and power supply voltage (sometimes called Vdd or Vcc). Assume the gates G of NMOSFET 14 and PMOSFET 16 are connected. Assume hole-electron pairs + and − are created in the p-substrate and also in the n-well of integrated circuit 10.

The electrons (−) in the n-well are attracted to Vdd and the holes (+) in the p-substrate are attracted to Vss. If PMOSFET 16 is on and NMOSFET 14 is off, the drains are pulled high (Vcc). In that case, the electrons (−) in the p-substrate are attracted to drain diffusion D of NMOSFET 14. If there are enough electrons attracted to drain diffusion D, the voltage state of node N1 might change from high to low. Likewise, if PMOSFET 16 is off and NMOSFET 14 is on, the drains are pulled low (Vss). In that case, the holes (+) in the n-well are attracted to drain diffusion D of PMOSFET 16. If there are enough holes attracted to drain diffusion D, the voltage state of node N1 might change from low to high. With a closed loop system, the change in state may be permanent.

There is a need for soft error resistant techniques for datapath and control circuits that have a relatively small effect on performance.

SUMMARY

In some embodiments, the invention includes a soft error resistant latch circuit. The latch circuit includes a storage node, a feedback node, and an inverter between the storage node and the feedback node. The latch circuit also includes split connection storage node drivers and split connection feedback node drivers each connected to the storage node and the feedback node.

In some embodiments, the invention includes a soft error resistant domino circuit a domino node, a keeper node, and a soft error resistant keeper. The soft error resistant keeper includes (a) a FET having a gate connected to the keeper node; (b) a FET having a gate connected to the domino node; and (c) an inverter between the domino and keeper nodes.

In some embodiments, the invention includes a soft error resistant domino circuit having a domino node, a keeper node, and an inverter between the domino and keeper nodes. The circuit also includes reverse connection keeper drivers connected between the domino node and the keeper node.

Additional embodiments are described and claimed.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

FIG. 3 is a schematic representation of a latch according to some embodiments of the invention.

FIG. 4 is a schematic representation of an optional modification to the latch of FIG. 4.

FIG. 5 is a block diagram representation of a die in which one or more of the various circuits of the invention may be included.

DETAILED DESCRIPTION

The invention involves circuits which are soft error resistant, yet still maintain high performance. The circuits include an inverter between first and second nodes, which makes state changes much more difficult. Examples of the first and second nodes include storage and feedback nodes in a latch, and domino and keeper nodes in a domino circuit. Soft error resistance is also increased through split connection node drivers and reverse connection keeper drivers, described below.

The present disclosure refers to p-channel field effect transistors (PETs) and n-channel field effect transistors (NFETs). The PFETs may be PMOSFETs or another type of p-channel field effect transistor. The NFETs may be NMOSFETs or another type of n-channel field effect transistor.

Latch Examples

Figure 2:
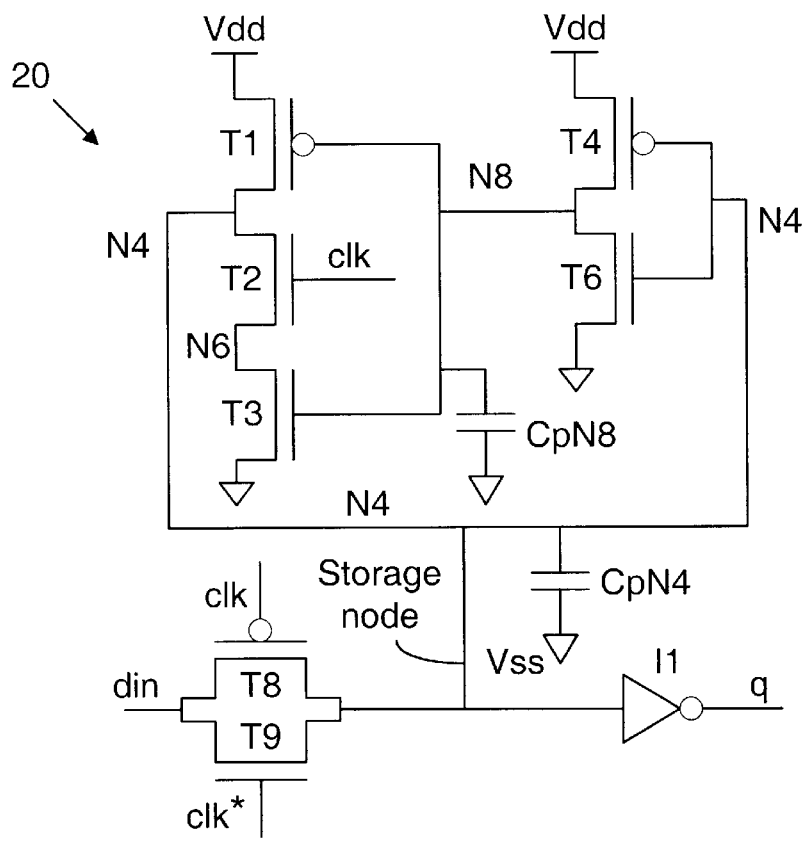
FIG. 2 is a schematic representation of a prior art latch.

Before describing embodiments of the present invention, FIG. 2 illustrates a prior art latch circuit 20 having a latch loop including a storage node N4, a feedback node N8, feedback node drivers, and storage node drivers, and a pass gate. The feedback node drivers include PFET T1 and NFET T3. The storage node drivers include PFET T4 and NFET T6. In some implementations, there may be an NFET (not shown) between T4 and T6, the gate of which is driven by a scan (test mode) signal. The pass gate includes PFET T8 and NFET T9. When a clock signal clk is low and clk* is high, pass gate transistors T8 and T9 are turned on and a value of input data signal din is written onto storage node N4. The value is inverted by an inverter I1 or other output circuitry to create a output signal q.

Node N4 has a parasitic capacitance CpN4 and node N8 has a parasitic capacitance CpN8. If there is a cosmic ray on any node, diffusion areas connected to that node may collect induced charge which may help cause soft errors. On the other hand, the overall capacitance (CpN4 and CpN8) and the recovery device (storage node and feedback node drivers) that hold the latch state fight against changes in state (soft errors). Cosmic rays may cause a low to high or high to low strike on both nodes N4 and N8, although the capacitance CpN4 is generally greater than CpN8, so node N4 may be less susceptible to soft errors through strikes associated with diffusions on node N4.

When clk is high, the voltage state on node N4 is maintained through transistors T1, T2, T3, T4, and T6 as follows. Assume node N4 is initially high. If node N4 is high, T4 is off and T6 is on pulling node N8 low. With node N8 low and clock high, T1 and T2 are on and T3 is off. With T1 on and T3 off, node N4 is kept high through T1. Assume there is a cosmic ray strike so that node N8 changes from low to high. In that case, T1 begins to turn off and T3 begins to turn on so node N4 begins to go low. As node N4 goes low, T4 starts to turn on and T6 starts to turn off which further pulls down node N8. Holes (positive charge) tend to be removed from node N8 through T6. Further, parasitic capacitance CpN8 on node N8 inhibits the change of node N8 from low to high. However, if the cosmic ray is strong enough, the state change of node N8 will be complete before the holes can be removed through T6. The invention involves a more soft error resistant circuit arrangement.

FIG. 3 illustrates a latch circuit 30 according to some embodiments of the present invention. Referring to FIG. 3, a latch circuit 30 including a storage node N14, a feedback node N18 and, a pass gate (including T8 and T9). In addition, latch circuit 30 includes split connection feedback node drivers, split connection storage node drivers, and an inverter I2 between the nodes N18 and N14. The split connection feedback node drivers include PFET T17 and NFET T16. The split connection storage node drivers include PFET T15 and NFET T18.

When a clock signal clk is low, pass gate transistors T8 and T9 are turned on and a value of input data signal din is written onto storage node N14. The value is inverted by an inverter I1 or other output circuitry to create a output signal q. (Note that the invention is not limited to particular details of the output circuit. The output signal may be inverted or not inverted.) Node N14 includes parasitic capacitance CpN14 and node N18 includes parasitic capacitance CpN18.

When clk is high, the voltage state on node N14 is maintained through transistors T15, T16, T17, T18, and T19 as follows. Assume that node N14 is initially high and node N18 is low. If node N14 is high, T15 is off and T18 is on. With clk high, T19 is on so that node N18 is pulled low. With N18 low, T16 is off and T17 is on pulling node N14 high. Further, with N18 low, inverter I2 also causes node N14 to be high. Assume there is a cosmic ray strike so that holes collecting on a diffusion associated with node N18 cause node N18 to change from low to high. In that case, T17 begins to turn off and T16 begins to turn on so node N14 starts to go low. Further, inverter I2 begins to pulls N14 low. As node N14 goes low, T18 starts to turn off and T15 starts to turn on which further pulls down node N18. However, the holes collecting on node N18 are removed from node N18 through T18 and T19 and the NFET of I2. Further, parasitic capacitance CpN18 on node N18 inhibits the change of node N18 from low to high. Gate capacitance of inverter I2 contributes to the parasitic capacitance CpN18, which is greater than CpN8 in FIG. 2. Also, the capacitance CpN14 resists change to node N14. The overall effect is a substantial improvement in soft error resistance. Yet, inverter I2 responds relatively quickly to intended changes in state caused by writing data through the pass gate (T8 and T9).

Still referring to FIG. 3, assume instead that node N14 is initially low and N18 is high with clk high. In that case, T17 and T18 are off and T15 is on pulling N18 high and T16 is on pulling N14 low. Then, assume a cosmic ray strike causes node N18 to change from high to low (a strike causes electrons to collect in a diffusion associated with node N18). In that case, T17 begins to turn on and T16 begins to turn off so that N14 begins to be pulled high. Also, inverter I2 begins to pull N14 high. However, parasitic capacitance CpN18 resists the change and the electrons (negative charge) collected on N18 are removed through T15 and the PFET of I2. Also, the capacitance CpN14 resists change to node N14. The overall effect is a substantial improvement in soft error resistance.

Assume node N14 is initially high and there is a cosmic ray strike producing electrons that collect in a diffusion associated with N14 that would tend to cause node N14 to change from high to low. The parasitic capacitances CpN14 and CpN18 will resist a change in state, while the electrons are removed from N14 through T17 and the PFET of I1. Now assume node N14 is initially low and there is a cosmic ray strike producing holes on a diffusion associated with on node N14 that would tend to cause node N14 to change from low to high. The parasitic capacitances CpN14 and CpN18 will resist a change in state, while the holes are removed through T16 and the NFET of I1. Although soft errors are still possible with sufficient induced charge, they are less likely with the invention.

Inverter I2 may be designed using minimum sized devices. There are additional diffusions on storage node N14 from inverter I2, however, for a large output driver, charge collection by the added diffusions tends to not cause soft errors. Due to these effects, in simulations, an embodiment of latch 30 of FIG. 3 yielded a 1.6X improvement in soft error resistance compared to prior art latch 20 of FIG. 2. In other embodiments, the difference in change in soft error resistance may be different. An embodiment of latch 30 had a 40 pico second decrease in the time it took from the clk signal being received to the time output signal q appears at the output (40 pS clk2q performance gain) at the expense of 20 pico second increase in the time it took from the data din being received to the time output signal q appears at the output (20 pS data2q penalty). There is only a small area penalty of latch 30 as compared to latch 20.

Inverter I2 could be added to latch 20 of FIG. 2 to produce an embodiment of the invention. Further, an embodiment could be latch 30 without inverter I2. However, the full benefit of latch 30 occurs because latch 30 includes inverter I2 and the two NFETs of the latch loop are swapped with split connection node drivers (contrast T12 and T6 of FIG. 2 with T18 and T16 of FIG. 3).

Note that the invention may encompass a variety of modifications to latch 30. For example, the order of T18 and T19 may change. There may be additional transistors. For example, as shown in FIG. 4, in some embodiments, an NFET T20 may be positioned between T16 and ground (Vss), the gate of which is driven by a scan (test mode) signal. The direction of inverter I2 could be changed so that N14 is at the input and N18 is at the output.

The various circuits described herein may be included in a die 50 shown in FIG. 5.

Domino Circuit Examples

The invention may also be used in domino circuits. Before describing embodiments, prior art domino circuits are described in connection with FIGS. 6 and 7, which are well known examples of precharge domino circuits having transistors (e.g., having NFET transistors in an n-stack). Also well known are predischarge domino circuits in which the domino node is predischarged to ground during a predischarge phase and selectively pulled high during an evaluate phase (e.g., through PFET transistors in a p-stack).

Figure 6:
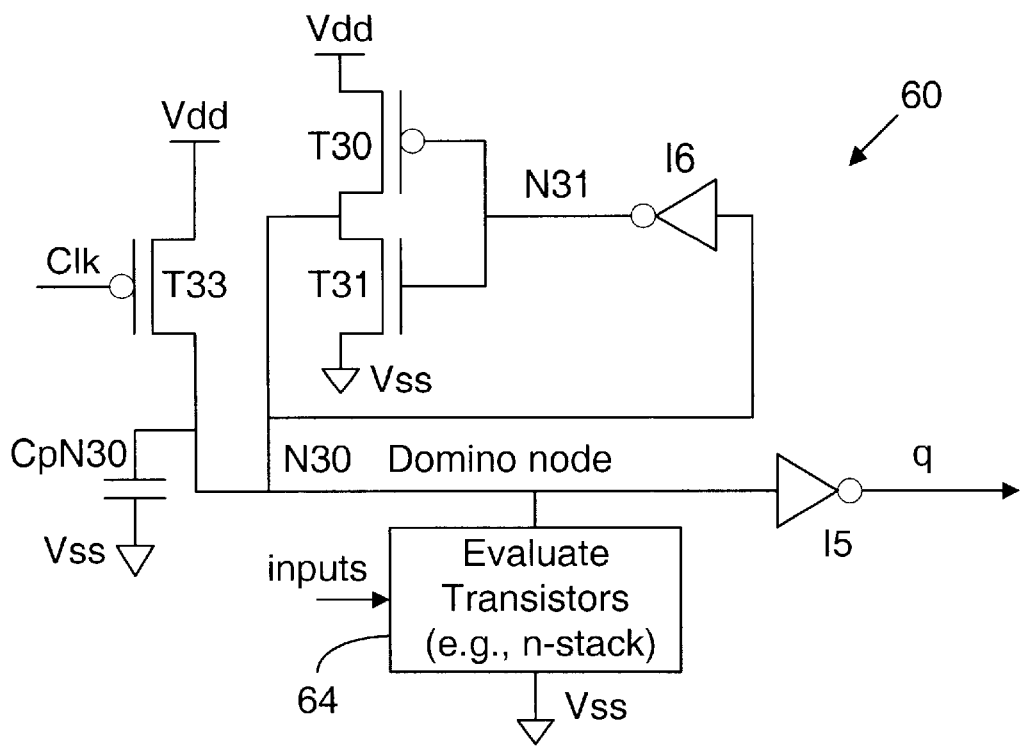
FIG. 6 is a schematic representation of a prior art precharge domino circuit with a full keeper.

Referring to FIG. 6, a domino circuit 60 includes a domino node N30, which is precharged through PFET T33 to Vdd in a precharge phase during which clock is low. Then, in an evaluate phase, during which clock is high, node N30 is conditionally brought low depending on the inputs to the evaluate transistors 64. Node N30 has a parasitic capacitance CpN30, which includes the gate capacitance of inverters 15 and 16. Keeper transistor T30 and inverter 16 keep node N30 high assuming evaluate transistors 64 do not pull it low. An NFET T31 keeps N30 low after evaluate transistors 64 pull it low. Node 31 between inverter 16 and T30 may be called a keeper node.

Figure 7:
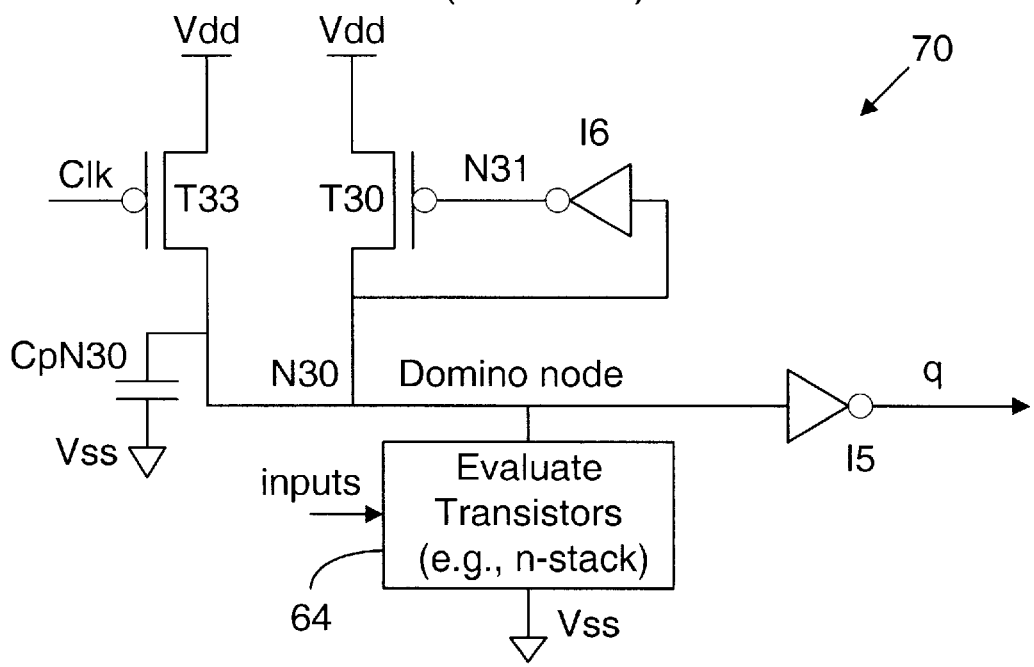
FIG. 7 is a schematic representation of a prior art precharge domino circuit with a half keeper.

Referring to FIG. 7, domino circuit 70 is like domino circuit 60 in FIG. 6, except that it does not include T31. Domino circuit 60 is referred to as a full keeper domino circuit and domino circuit 70 is referred to as a half keeper domino circuit.

The domino node N30 is strongly driven by the precharge PFET driven by clk during the precharge phase. During the evaluate phase, when the inputs are such that evaluate transistors 64 provide a path to ground, there is a strong pulldown strength on node N30. However, when the inputs are such that N30 is not pulled to the low state by evaluate transistors 64, a weak keeper T30 is holding the domino node at the high state. Hence domino node N30 is susceptible for soft errors during the evaluate phase when the domino node is held high by the weak keeper. Assume a cosmic ray strike causes electrons to change domino node N30 from high to low. In that case, inverter I6 will change node N31 from low to high turning off T30 (and turning on T31 in the case of circuit 60.) Capacitance CpN30 will fight the change while the electrons are removed through T30 or the PFETs of 15 and 16. Upsizing the keeper is one common solution to avoid soft errors. However, this slows the performance.

The present invention provides increased soft error resistance as compared to that of FIGS. 6 and 7, while providing good performance.

Figure 8:
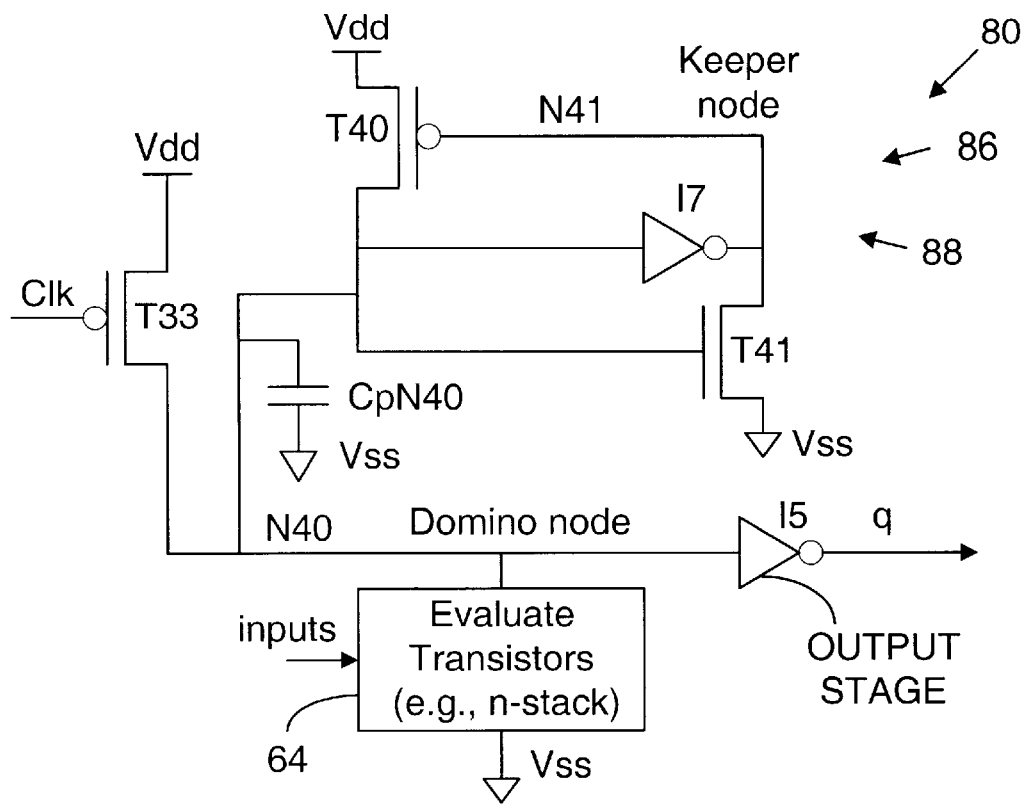
FIG. 8 is a schematic representation of a precharge domino circuit according to some embodiments of the invention.

Referring to FIG. 8, domino circuit 80 includes a domino node N40 and a feedback node N41. An inverter I7 is positioned between nodes N40 and N41. A PFET T40 is a keeper, such that when N40 is high, node N41 is low and T40 pulls up N40. (T40 and T41 may tend to be weak to allow greater switching speed.) Also, when N40 is high, T41 is on pulling N41 low, keeping T40 on. T40, T41 and inverter I7 form a soft error resistant keeper circuit 86. Further, reverse connection keeper drivers 88 includes driver T40 to pull up node N40 and driver T41 to pull down node N41. Inverter I7 can pull up or pull down node N41.

Parasitic capacitance CpN40 is the parasitic capacitance of node N40 and includes gate capacitance of inverters I5 and I7. Although the output stage is shown as an inverter I5, it may be another circuit. The invention is not restricted to a particular kind of output stage or having any output stage at all.

When N40 is high, there is a chance for it to be made low through a high to low strike on N40 or a low to high strike on N41. Assume N40 is high and a cosmic ray strike causes electrons to collect in a diffusion associated with node N40. In that case, N40 would tend to change from high to low. T41 would start to turn off and I7 would start to switch so N41 would start to go high causing T40 to start to turn off. However, the capacitance CpN40 would fight against a change of state (from high to low) in N40 while electrons would be removed from node N40 through T40 and the PFETs of 15 and 17. The invention provides a timing advantage. When the PFET of I7 starts to pull up, the NFET of I7 is still pulling down. Inverter I7 could be skewed so that the NFET is more powerful. The overall effect of circuit 80 is a significantly improved soft error reduction with a relatively high switch speed performance (i.e., speed in output signal q responding to a change in inputs during the evaluate phase). Although soft errors are still possible, they are less likely.

Assume N41 is low and a cosmic ray strike causes holes to collect in a diffusion associated with node N41. In that case, N41 would tend to change from low to high. T40 would start to turn off. However, holes would be removed through T41. Further, the parasitic gate capacitance of T40 would fight the change on node N41. Parasitic capacitance CpN40 would fight the change in node N40. The overall effect is that holes tend to be removed through T41 before T41 turns off and soft error resistance is improved. In alternative embodiments, the orientation of 17 is changed so the input of I7 is at N41 and the output is at N40 Oust the opposite in FIG. 9, discussed below). In that case, N41 has more capacitance and N40 has less.

When node N40 is low, the evaluate transistors pull it low fairly hard so there is relatively little chance of it changing from low to high (likewise, little change of a strike to node N41 changing node N40 when N40 is low.)

In some embodiments, domino circuit 60 includes only one p-n pair compared with the new latch configuration, latch 30 presented above. The reason being, the keeper has to maintain a single state, namely high, only on the domino node. As compared with a prior art full keeper circuit 60, the keeper circuit of FIG. 8 does not include an n-diffusion on the domino node. In an embodiment, a simulation of this new configuration yielded about a 1.4X soft error resistance improvement compared to full and half keeper versions of prior art domino circuits 60 and 70. Circuit 80 has about the same area as full keeper circuit 60. In an embodiment, the performance of a simulation of circuit 80 is essentially identical to the half keeper dynamic gate and better than a full keeper dynamic gate.

Figure 9:
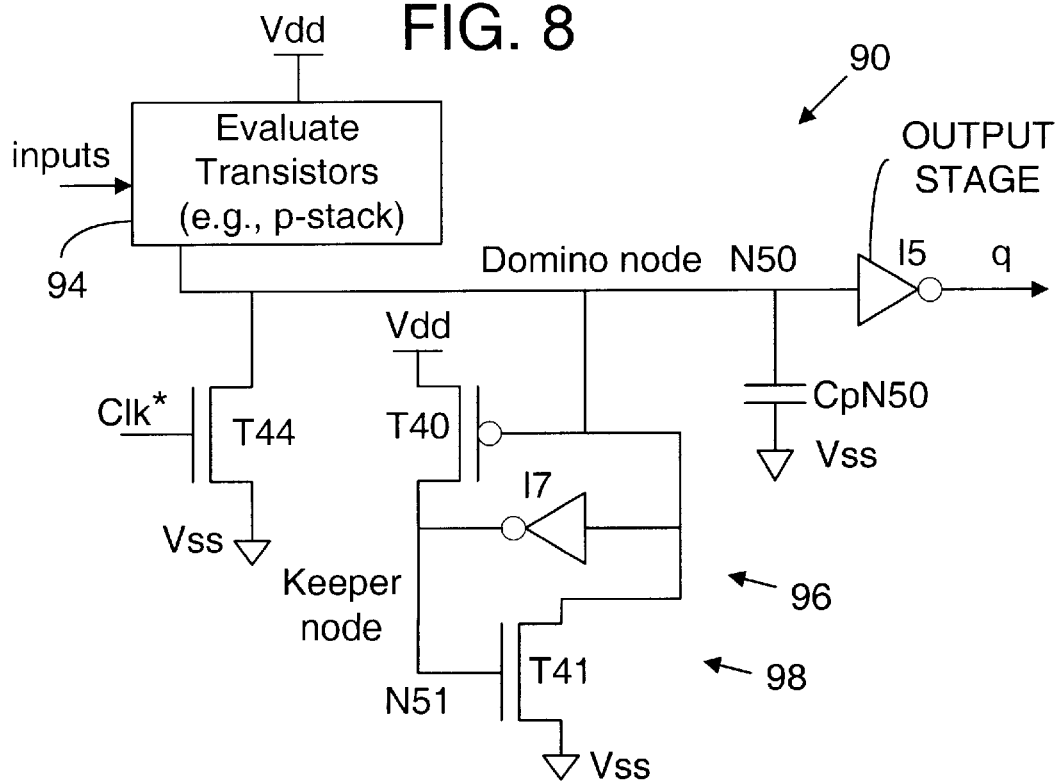
FIG. 9 is a schematic representation of a predischarge domino circuit according to some embodiments of the invention.

FIG. 9 provides an example of the invention with a predischarge domino circuit 90 having a domino node N50 that is precharged to ground (predischarged) through NFET T44 when clk is low (clk* is high) during a predischarge phase. Domino node N50 is selectively pulled high through evaluate transistors 94 during an evaluate stage. Parasitic capacitance CpN50 is the parasitic capacitance of node 50 includes the gate capacitance of inverters I5 and I7. A feedback node N5 1 is between PFET T40 and NFET T41.

In FIG. 9, T40, T41 and inverter I7 form a soft error resistant keeper circuit 96. Further, reverse connection keeper drivers 98 includes driver T40 to pull up node N50 and driver T41 to pull down node N4 1. Inverter I7 can pull up or pull down node N50. Other arrangements for soft error resistant keeper circuit 96 and reverse connection keeper drivers 98 could be used.

Assume N50 is low and a cosmic strike causes holes to collect in a diffusion(s) associated with N50. In that case, N50 tends to change from low to high. T40 would start to turn off and I7 would start to turn on. When node N50 is high, the evaluate transistors pull it fairly hard.

OTHER INFORMATION AND EMBODIMENTS

Figure 1:
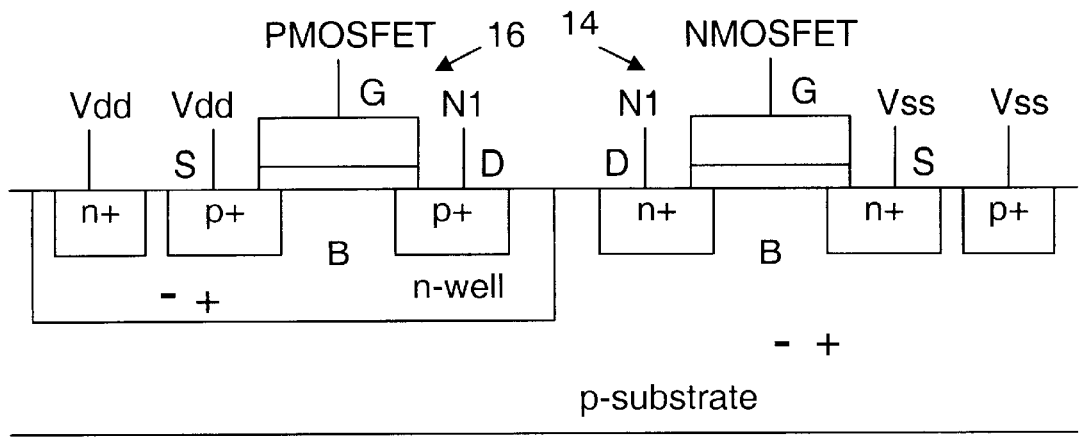
FIG. 1 is a schematic cross-sectional representation of transistors in an integrated circuit.

The invention is not restricted to use with any particular integrated circuit arrangement. For example, although enhancement mode transistors are shown, depletion mode transistors may be used. Although a p-substrate and n-well arrangement is shown in FIG. 1, a different arrangement may be used (e.g., n-substrate; p-well in p-substrate). The transistors may be forward, zero, or reverse biased. Additional transistors (e.g., for testing) may be included in the circuit without departing from the invention). The invention is not restricted to a precise order or timing of signals (e.g., clock signal with respect to other signals.)

In general, the sizes and threshold voltages of the various transistors can be set to achieve desired performance versus soft error resistance tradeoffs.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A soft error resistant latch circuit, comprising:
   a storage node;
   a feedback node;
   an inverter between the storage node and the feedback node, wherein the inverter has an input at the feedback node and an output at the storage node; and
   split connection storage node drivers and split connection feedback node drivers each connected to the storage node and the feedback node.

2. The circuit of claim 1, wherein the split connection storage node drivers include a PFET having a gate connected to the storage node and a diffusion connected to the feedback node.

3. The circuit of claim 1, wherein the split connection feedback node drivers includes a PFET having a gate connected to the feedback node and a diffusion connected to the storage node.

4. The circuit of claim 1, wherein the split connection storage node drivers include a PFET having a gate connected to the storage node and an NFET having a diffusion coupled to the feedback node.

5. The circuit of claim 1, wherein the split connection feedback node drivers includes a PFET pull-up transistor having a gate connected to the feedback node and an NFET having a diffusion coupled to the storage node.

6. The circuit of claim 1, further comprising an output circuit, which is an inverter.

7. The circuit of claim 1, further comprising an additional FET connected to a FET of the split connection storage node drivers and which receives a clock signal to its gate.

8. The circuit of claim 1, further comprising a pass gate connected to the first node to selectively write data onto the storage node.

9. The circuit of claim 1, further comprising an additional FET connected to a FET of the split connection feedback node drivers and which receives a test signal to its gate.

10. A soft error resistant domino circuit, comprising:
    a domino node;
    a keeper node;
    a soft error resistant keeper including:
    (a) a FET having a gate connected to the keeper node;
    (b) a FET having a gate connected to the domino node; and
    (c) an inverter between the domino and keeper nodes.

11. The circuit of claim 10, wherein the domino circuit is a predischarge domino circuit.

12. The circuit of claim 10, wherein the domino node is the input to the inverter and the keeper node is the output to the inverter.

13. The circuit of claim 10, the FET having a gate connected to the keeper node is a PFET and the FET having a gate connected to the domino gate is an NFET and wherein a diffusion of the NFET is connected to the keeper node.

14. The circuit of claim 13, wherein a diffusion of the NFET is coupled to ground.

15. The circuit of claim 10, the FET having a gate connected to the keeper node is an NFET and the FET having a gate connected to the domino gate is a PFET and wherein a diffusion of the NFET is connected to the domino node.

16. The circuit of claim 10, wherein the domino circuit is a precharge domino circuit.

17. A soft error resistant domino circuit, comprising:
    a domino node;
    a keeper node;
    an inverter between the domino and keeper nodes; and
    reverse connection keeper drivers connected between the domino node and the keeper node.

18. The circuit of claim 17, wherein the domino circuit is a predischarge domino circuit.

19. The circuit of claim 17, wherein the reverse connection keeper drivers include a PFET having a gate connected to the keeper node and an NFET having a gate connected to the domino node.

20. The circuit of claim 17, wherein the reverse connection keeper drivers include a PFET having a gate connected to the domino node and an NFET having a gate connected to the keeper node.

21. The circuit of claim 17, wherein the domino node is the input to the inverter and the keeper node is the output to the inverter.

22. The circuit of claim 17, wherein the domino circuit is a precharge domino circuit.

23. A soft error resistant latch circuit, comprising:
   a storage node;
   a feedback node;
   an inverter between the storage node and the feedback node;
   split connection storage node drivers and split connection feedback node drivers each connected to the storage node and the feedback node; and
   an additional FET connected to a FET of the split connection storage node drivers and which receives a clock signal to its gate.

24. The circuit of claim 23, wherein the inverter has an input at the feedback node and an output at the storage node.

25. The circuit of claim 23, wherein the split connection storage node drivers include a PFET having a gate connected to the storage node and a diffusion connected to the feedback node.

26. The circuit of claim 23, wherein the split connection feedback node drivers includes a PFET having a gate connected to the feedback node and a diffusion connected to the storage node.

27. The circuit of claim 23, wherein the split connection storage node drivers include a PFET having a gate connected to the storage node and an NFET having a diffusion coupled to the feedback node.

28. The circuit of claim 23, wherein the split connection feedback node drivers includes a PFET pull-up transistor having a gate connected to the feedback node and an NFET having a diffusion coupled to the storage node.

29. A soft error resistant latch circuit, comprising:
   a storage node;
   a feedback node;
   an inverter between the storage node and the feedback node;
   split connection storage node drivers and split connection feedback node drivers each connected to the storage node and the feedback node; and
   an additional FET connected to a FET of the split connection feedback node drivers and which receives a test signal to its gate.

30. The circuit of claim 29, wherein the inverter has an input at the feedback node and an output at the storage node.

31. The circuit of claim 29, wherein the split connection storage node drivers include a PFET having a gate connected to the storage node and a diffusion connected to the feedback node.

32. The circuit of claim 29, wherein the split connection feedback node drivers includes a PFET having a gate connected to the feedback node and a diffusion connected to the storage node.

33. The circuit of claim 29, wherein the split connection storage node drivers include a PFET having a gate connected to the storage node and an NFET having a diffusion coupled to the feedback node.

34. The circuit of claim 29, wherein the split connection feedback node drivers includes a PFET pull-up transistor having a gate connected to the feedback node and an NFET having a diffusion coupled to the storage node.

* * * * *

UNITED STATES PATENT AND TRADEMARK OFFICE
CERTIFICATE OF CORRECTION

PATENT NO.     : 6,366,132 B1
DATED          : April 2, 2002
INVENTOR(S)    : Karnik et al.

It is certified that error appears in the above-identified patent and that said Letters Patent is hereby corrected as shown below:

Column 2,
Line 60, delete "PETs", insert -- PFETs --.

Column 4,
Lines 14 and 27, delete "12", insert -- I2 --.

Column 5,
Lines 28 and 55, delete "15", insert -- I5 --.
Line 29, delete both occurrences of "16", insert -- I6 -- instead.
Lines 32 and 55, delete "16", insert -- I6 --.

Column 6,
Line 21, delete "15", insert -- I5 --.
Lines 21, 39 and 40, delete "17", insert -- I7 --.
Line 40, delete "Oust", insert -- (just --.

Signed and Sealed this

First Day of April, 2003

JAMES E. ROGAN
*Director of the United States Patent and Trademark Office*